United States Patent
Smith

(10) Patent No.: US 6,781,429 B1
(45) Date of Patent: Aug. 24, 2004

(54) LATCH CIRCUIT WITH METASTABILITY TRAP AND METHOD THEREFOR

(75) Inventor: David W. Smith, Cedar Park, TX (US)

(73) Assignee: Advanced Micro Devices, Austin, TX (US)

( * ) Notice: Subject to any disclaimer, the term of this patent is extended or adjusted under 35 U.S.C. 154(b) by 0 days.

(21) Appl. No.: 10/465,417

(22) Filed: Jun. 18, 2003

(51) Int. Cl.[7] ............................................. H03K 3/037
(52) U.S. Cl. ........................ 327/217; 327/199; 326/94
(58) Field of Search ............................... 327/141, 142, 327/144, 145, 198–200, 215, 217, 218, 219; 326/94

(56) References Cited

U.S. PATENT DOCUMENTS

| | | | |
|---|---|---|---|
| 5,625,309 A | * | 4/1997 | Fucili et al. ................. 327/217 |
| 6,531,905 B1 | * | 3/2003 | Wang .......................... 327/218 |
| 6,642,763 B2 | * | 11/2003 | Dike ........................... 327/202 |

OTHER PUBLICATIONS

Logic Design Information. Logic Metastability [online]. Leroy Davis, 1998–2003 Retrieved from Internet: <URL: www.interfacebus.com/Design_MetaStable.html>.
"Metastable Response in 5–V Logic Circuits", Document No. SDYAA006, Texas Instruments Inc., Feb. 1997.

* cited by examiner

*Primary Examiner*—Long Nguyen

(57) ABSTRACT

Method and apparatus are provided for trapping metastability events to provide a metastable-free output signal. At least three successive values of an input signal are latched successively over a predetermined period which is less than half of a fundamental period of the input signal to provide at least three corresponding latched values. First and second intermediate signals are activated when outputs of all of the at least three corresponding latched values are in respective first and second logic states. An output signal is placed in a first predetermined logic state in response to the second intermediate signal and is changed from the first predetermined logic state to a second predetermined logic state in response to the first intermediate signal.

20 Claims, 3 Drawing Sheets

LATCH CIRCUIT WITH METASTABILITY TRAP AND METHOD THEREFOR

TECHNICAL FIELD OF THE INVENTION

The present invention generally relates to electrical circuits, and more particularly relates to latch circuits for receiving an input signal using a clock signal that is asynchronous to the input signal.

BACKGROUND OF THE INVENTION

Digital integrated circuits (ICs) generally operate in a synchronous mode. Data is transmitted synchronously within an IC when a clock signal captures the data output by one stage at the input of another stage. Clock signals are distributed all around the various stages and functional units on an IC and, along with signals used to select the intended stage or unit, cause the capturing of the data. Various circuits are used to capture data, such as flip-flops and latches, and even though each operates somewhat differently, they all utilize clock signals to capture data.

Capturing data at the input of a stage within an IC can be easily accomplished as long as a proper relationship between transitions in the clock and data signals is maintained. This proper relationship is usually defined in terms of minimum setup and hold times and can usually be controlled within the IC. However a problem arises when data is transferred between two domains that operate asynchronously with respect to each other. For example an IC may receive an external signal that is asynchronous to the IC's internal clock signal. Capturing circuits such as flip-flops are unable to capture the external signal when the signal changes during a transition in the clock signal since the signal is in mid-transition. In addition not only is the data not "caught" or captured correctly at that edge, but additionally the capturing circuit suffers from a "confusion" of sorts. It captures a "confused" or intermediate mid-point value which is then output to the next stage requiring data. The time it takes for the capturing circuit to become "unconfused" can be statistically determined, but can be in some rare cases quite long. So the problem is not so much that the data is not captured perfectly at the exact earliest edge possible, but that the capturing device can be forced into this confused state . The confused state is known as metastability. Once a flip-flop becomes metastable, its output can take a significant amount of time to correctly transition to a recognizable logic state, and sometimes this logic state is not the correct one. The output signal can take many forms during metastability, such as assuming an intermediate voltage and oscillating for an extended period.

The metastability problem can be avoided within a digital IC or between digital ICs by obeying minimum setup and hold times. Most busses used to communicate data and actions between various ICs are specified so that data is always ready to be input at the input of the next IC or section in time for the next clock, in much the same way that circuits within an IC are designed.

However no known circuit can guarantee the correct operation of a capturing device with a completely unknown external data transition. While some precautions can be taken to reduce the effects of metastability, no known circuit can completely remove it. FIG. 1 illustrates a latch circuit 20 that reduces the effects of metastability known in the prior art, including a buffer 22 and two clocked D-type flip-flops 24 and 26. Flip-flops 24 and 26 are driven by the same clock signal, and the output of the first flip-flop 24, labeled "Q1", feeds the D input of the second flip-flop 26. The output of flip-flop 26, labeled "Q2", forms the output of latch circuit 20. Latch circuit 20 operates under the assumption that a single stage flip-flop will "settle" (end its metastability) within a fixed period of time, and thus be stable before the clock of the next stage transitions. Statistically, the relationship between the inherent settling time and the clock rate of the system determines the likelihood of the metastability working its way through the two flip-flops and into the synchronous system. But it does not eliminate the chance of a metastability-induced error.

This phenomenon is better understood with respect to FIG. 2, which illustrates a timing diagram 30 useful in understanding the operation of latch circuit 20 of FIG. 1. In FIG. 2 the horizontal axis represents time and the vertical axis the amplitude, in volts, of several relevant signals. As shown the INPUT signal makes a transition between a logic low value and a logic high value. In order to avoid metastability, the INPUT signal should be settled for at least a setup time labeled "$t_{SU}$" before the rising edge of the CLOCK signal. As shown in FIG. 2 the CLOCK input signal makes a transition just within $t_{SU}$ and metastability results. Thus signal Q1 initially assumes an intermediate value. Alternatively instead of assuming an intermediate value, the metastable state may cause signal Q1' to oscillate between states before finally resolving to a recognizable logic state. As long as the metastability has ended by the next transition of the CLOCK signal, no ultimate problem will result. Even if the metastable condition resolves to a low level, the high level will be recognized at the input of flip-flop 26 at the following CLOCK signal and the operation of the circuit is not affected by the metastability.

However the decay time of the metastable event is statistically variable and even in latch circuit 20 there is some probability that the metastable state will last long enough to be seen at the input of flip flop 26 and thus reach the output. The probability is related to the CLOCK rate and increases with increases in the CLOCK rate. The fastest rate at which the two flip-flops can be clocked is set by the known statistical decay of the metastable event in flip-flop 24, and this value is not guaranteed for all time. This lack of predictability of the circuit and the remote chance that it could pass a metastable event makes it and other similar circuits less than perfect. An additional flip-flop stage could be added to the output of flip-flop 26 but this additional flip-flop would increase the group delay through latch circuit 20 and may not be tolerable.

Accordingly, it would be desirable to have a latch circuit which is able to provide an output signal as a correct representation of an input signal regardless of when the input signal changes state in relation to a clock signal. These and other desirable features and characteristics of the present invention will become apparent from the subsequent detailed description and the appended claims, taken in conjunction with the accompanying drawings and the foregoing technical field and background.

BRIEF SUMMARY OF THE INVENTION

A latch circuit with a metastability trap is provided. The latch circuit includes at least three input latches, a first logic gate, a second logic gate, and a flip-flop. The at least three input latches capture values of an input signal at corresponding successive points in time distributed over a predetermined period which is less than half of a fundamental period of the input signal. The first logic gate has a plurality of input terminals coupled to corresponding output terminals of each of the at least three input latches, and an output terminal for providing a first intermediate signal. The first logic gate activates the first intermediate signal in response to signals at all of the plurality of input terminals being in a first logic state, and keeps the first intermediate signal inactive otherwise. The second logic gate has a plurality of input terminals coupled to corresponding output terminals of each of the at least three input latches, and an output terminal for providing a second intermediate signal. The second logic gate activates the second intermediate signal in response to signals at all of the plurality of input terminals being in a second logic state. The second logic gate keeps the second intermediate signal inactive otherwise. The flip-flop has a set input terminal coupled to the output terminal of the second logic gate, a reset terminal coupled to the output terminal of the first logic gate, and an output terminal for providing an output signal of the latch circuit.

A method is also provided for trapping metastability events to provide a metastable-free output signal. At least three successive values of an input signal are latched over a predetermined period which is less than half of a fundamental period of the input signal to provide at least three corresponding latched values. A first intermediate signals is activated when all of the at least three corresponding latched values are in a first logic state. A second intermediate signal is activated when all of the at least three corresponding latched values are in a second logic state. An output signal is placed in a first predetermined logic state in response to the second intermediate signal and is changed from the first predetermined logic state to a second predetermined logic state in response to the first intermediate signal.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
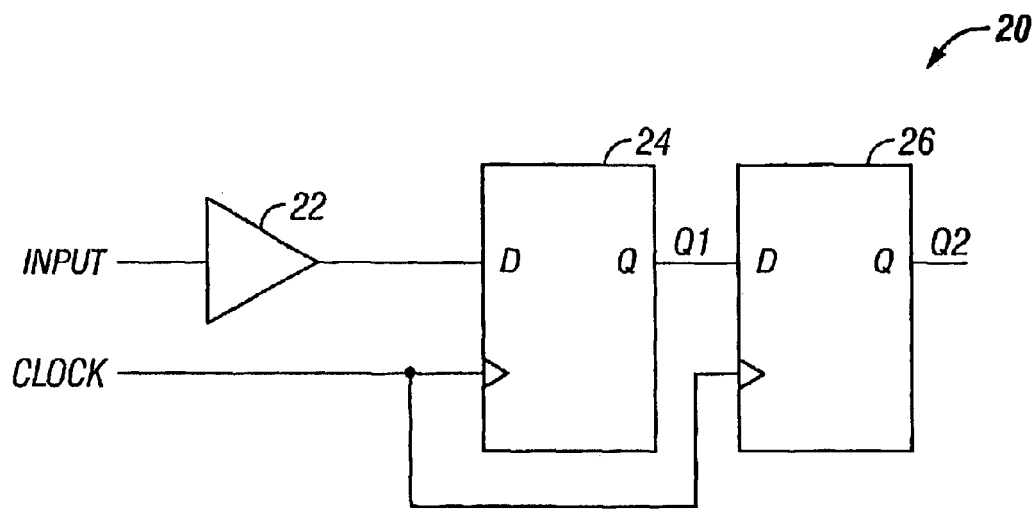
FIG. 1 illustrates in logic diagram form a latch circuit that reduces the effects of metastability known in the prior art.
Figure 2:
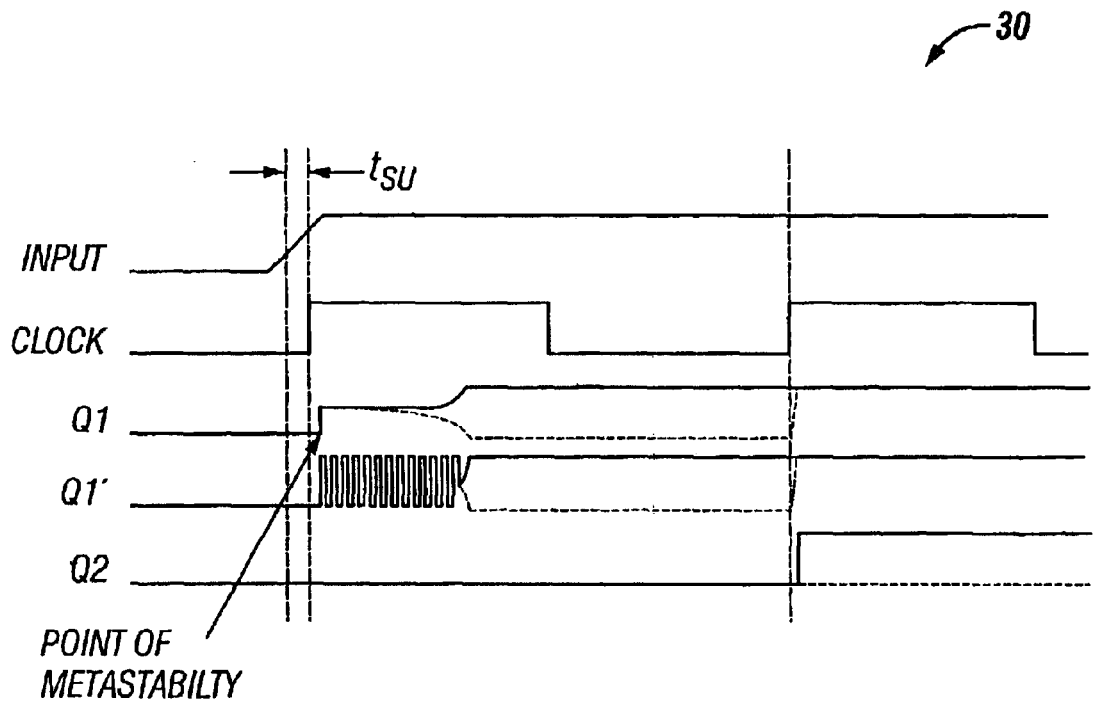
FIG. 2 illustrates a timing diagram useful in understanding the operation of the latch circuit of FIG. 1.
Figure 3:
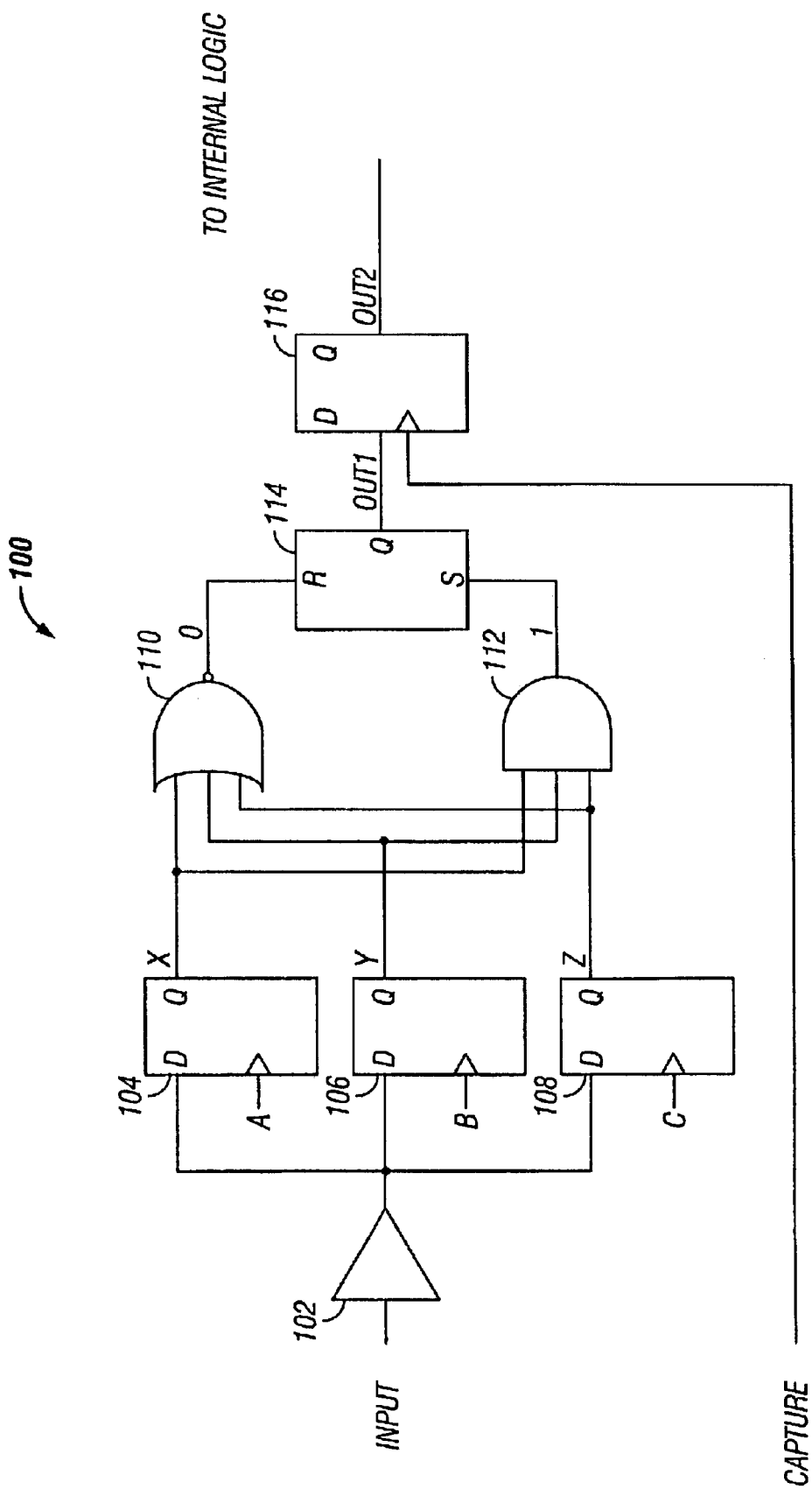
FIG. 3 illustrates in logic diagram form a latch circuit with a metastability trap according to the present invention.

FIG. 3 illustrates in logic diagram form a latch circuit 100 with a metastability trap according to the present invention. Latch circuit 100 includes a buffer 102, three input D-type flip-flops 104, 106, and 108, a three-input NOR gate 110, a three-input AND gate 112, an SR-type flip-flop 114, and an output D-type flip-flop 116. Buffer 102 has an input for receiving an input signal labeled "INPUT", and an output. Flip-flop 104 has a D input terminal connected to the output terminal of buffer 102, a clock input terminal for receiving a clock signal labeled "A", and a Q output terminal for providing a signal labeled "X". Flip-flop 106 has a D input terminal connected to the output terminal of buffer 102, a clock input terminal for receiving a clock signal labeled "B", and a Q output terminal for providing a signal labeled "Y". Flip-flop 108 has a D input terminal connected to the output terminal of buffer 102, a clock input terminal for receiving a clock signal labeled "C", and a Q output terminal for providing a signal labeled "Z". NOR gate 110 has a first input terminal connected to the Q output terminal of flip-flop 104, a second input terminal connected to the Q output terminal of flip-flop 106, a third input terminal connected to the Q output terminal of flip-flop 108, and an output terminal for providing a first intermediate signal labeled "0". AND gate 112 has a first input terminal connected to the Q output terminal of flip-flop 104, a second input terminal connected to the Q output terminal of flip-flop 106, a third input terminal connected to the Q output terminal of flip-flop 108, and an output terminal for providing a second intermediate signal labeled "1". Flip-flop 114 has an S input terminal connected to the output terminal of AND gate 112, an R input terminal connected to the output terminal of NOR gate 110, and a Q output terminal for providing a first output signal labeled "OUT1". Flip-flop 116 has a D input terminal connected to the Q output terminal of flip-flop 114, a clock input terminal for receiving a clock signal labeled "CAPTURE", and a Q output terminal for providing a second output signal labeled "OUT2" to internal logic (not shown in FIG. 3).

Latch circuit 100 provides a metastability trap by accepting the metastable condition as an input but protecting the system from its effects. Input latches 104, 106, and 108 capture successive values of the INPUT signal. Signals X, Y, and Z output from input latches 104, 106, and 108 represent values of the INPUT signal sampled at three successive times by successive clock signals A, B, and C. These successive times are selected to eliminate metastability in at least two of those values and thus, as will be described more fully below, clock signals A, B, and C are selected to have transitions distributed over a predetermined period which is less than half of a minimum fundamental period of the INPUT signal.

In alternate embodiments, other techniques can be used to capture three or more successive values of the INPUT signal. In one such alternate embodiment, a common clock signal could be used to clock three latch circuits and the INPUT signal could be successively delayed using delay lines. In another alternate embodiment three different clock signals A, B, and C could themselves be generated using delay lines. Each of these embodiments share the characteristic that they capture values of the INPUT signal at three successive points in time, the points in time occurring over a predetermined period which is less than half of the minimum fundamental period of the INPUT signal.

Signals X, Y, and Z are input to NOR gate 110 and AND gate 112 to detect whether they have all assumed the same logic state, either all logic low as detected by NOR gate 110 or all logic high as detected AND gate 112. Since only one signal can be metastable at any one time within the capturing window, the other two values are used to "protect" the final output value from the metastability. Note that in other embodiments NOR gate 110 and AND gate 112 could be replaced with an OR gate and a NAND gate, respectively, to implement the same functions in negative logic.

The outputs of NOR gate 110 and AND gate 112 are intermediate signals that are used to change the value of the first output signal OUT1. Thus the output signal from AND gate 112 is used to set the output of flip-flop 114 to a "1"

state (logic high), and the output signal from NOR gate 110 is used to reset the output of flip-flop 114 to a "0" state (logic low). It should be apparent that many other types of sequential circuits may be used in place of SR flip-flop 114, such as a JK flip-flop, a clocked D-latch in which the D input is tied to a logic high level, the output of AND gate 112 is connected to the clock input, and the output of NOR gate 110 is connected to the reset input, etc.

Figure 4:
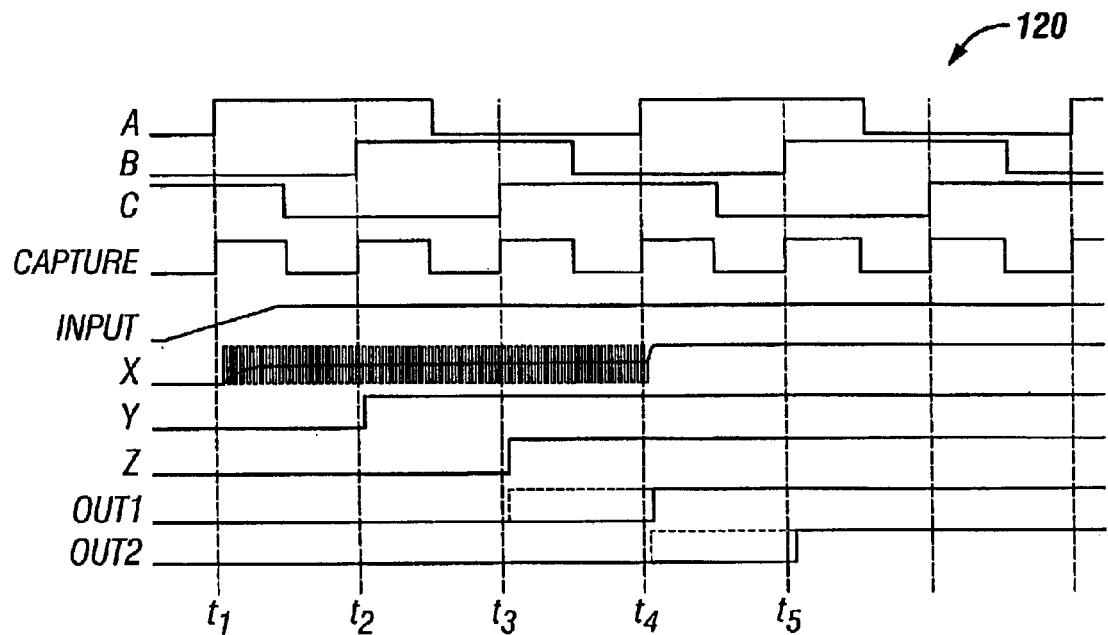
FIG. 4 illustrates a timing diagram of various signals in the latch circuit of FIG. 3.

The operation of latch circuit 100 is better understood with respect to FIG. 4, which illustrates a timing diagram 120 of various signals in latch circuit 100. In FIG. 4 the horizontal axis represents time and the vertical axis the amplitude, in volts, of several relevant signals. Signals A, B, and C are activated successively and are related to the CAPTURE clock as follows. Clock signal A is activated on a first rising edge of the CAPTURE clock signal; clock signal B is activated on a second rising edge of the CAPTURE clock signal; and clock signal C is activated on a third rising edge of the CAPTURE clock signal. Each of these signals has a fifty percent duty cycle over a period equal to three periods of the CAPTURE clock, and is generated from the CAPTURE clock by a clock circuit, not shown in FIG. 3.

As shown in FIG. 4, the INPUT signal gradually changes from a logic low to a logic high around time t1. Also around t1 the CAPTURE and A clock signals make a low-to-high transition. Signal X output from flip-flop 104 is in a metastable state, which is shown as an oscillating signal overlying a signal at an intermediate logic state because the form in which the metastable condition actually takes will vary based on the circuit implementation. Since the INPUT signal has reached its logic high state by the low-to-high transition of the next successive clock signals B and C at times t2 and t3, respectively, corresponding outputs Y and Z transition to a logic high in sequence.

In the example shown in FIG. 4 the metastable event in latch 104 persists until the next rising edge of the A clock signal at time t4. Between t3 and t4 AND gate 112 sees logic highs on its second and third inputs and an indeterminate level on its first input. If the metastability event causes oscillation on the output of latch 104, AND gate 112 resolves to a logic high during the high phase of the oscillation shortly after t3 and sets flip-flop 114. If however the metastability event causes an intermediate level on the output of latch 104, then AND gate 112 may not resolve to a logic high and flip-flop 114 may not be set until t4. At the next rising edge of the A clock at time t4, latch 104 recognizes a logic high input and since all three inputs of AND gate 112 are at logic high states, flip-flop 114 will assume a logic high state if it has not already done so. The second output, OUT 2, follows OUT1 on the next rising edge of the CAPTURE clock and so will change from a logic low to a logic high at t4 or t5 depending on the character of the metastability event.

Figure 5:
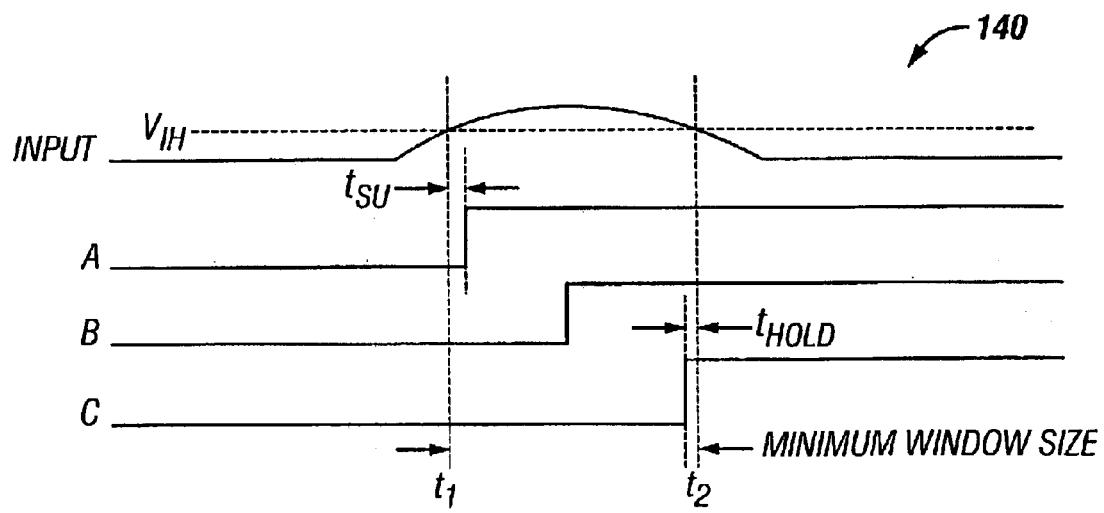
FIG. 5 illustrates a timing diagram of signals useful in understanding the present invention.

As mentioned above there is a restriction on the A, B, and C clocks to ensure that only one latch sees a metastability event. This restriction is better understood with respect to FIG. 5, which illustrates a timing diagram 140 of signals useful in understanding the present invention. In FIG. 5 the horizontal axis represents time and the vertical axis the amplitude, in volts, of several relevant signals. As shown in FIG. 5 the INPUT signal starts out at a logic low and makes a transition to a logic high around a time labeled "$t_1$" by passing through a logic high threshold value labeled "$V_{IH}$". This transition occurs a setup time labeled "$t_{SU}$" before a low-to-high transition of the A clock. The INPUT signal falls below $V_{IH}$ around a time labeled "$t_2$" while making a high-to-low transition. This transition occurs a hold time labeled "$t_{HOLD}$" after a low-to-high transition of the C clock. To avoid the possibility of two metastable events being captured by latches 104, 106, and 108, signals A, B, and C need to be activated successively while the INPUT signal is at a logic high, that is between $(t_1+t_{SU})$ and $(t_2-t_{HOLD})$. Thus a MINIMUM WINDOW SIZE is defined as the difference between t1 and t2. Since the high time of the INPUT signal represents the minimum high time, a full period of the INPUT signal represents its minimum fundamental period. The MINIMUM WINDOW SIZE is thus about half of the fundamental period of the INPUT signal, and when clocks A, B, and C all transition within this amount of time (less setup and hold times) no more than one metastable event can occur.

Thus latch circuit 100 traps metastability events from reaching internal circuitry by taking at least three successive samples of an input signal and determining when the samples indicate the same logic state. If the clock signals used to trigger corresponding input latches occur in less than about half of the minimum fundamental period of the INPUT signal, then at most one sample can be metastable at any given time. The metastable output of any one latch is protected by the remaining latches. It should be apparent that in other embodiments more than three latches may be used. The latch circuit may also be implemented with positive logic as shown or with corresponding negative logic. Also various types of latches and flip-flops may be substituted for the ones shown to achieve the same results.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A latch circuit with a metastability trap comprising:
   at least three input latches capturing values of an input signal at corresponding successive points in time distributed over a predetermined period which is less than half of a fundamental period of said input signal;
   a first logic gate having a plurality of input terminals coupled to corresponding output terminals of each of said at least three input latches, and an output terminal for providing a first intermediate signal, said first logic gate activating said first intermediate signal in response to signals at all of said plurality of input terminals being in a first logic state, and keeping said first intermediate signal inactive otherwise;
   a second logic gate having a plurality of input terminals coupled to corresponding output terminals of each of said at least three input latches, and an output terminal for providing a second intermediate signal, said second logic gate activating said second intermediate signal in response to signals at all of said plurality of input terminals being in a second logic state, and keeping said second intermediate signal inactive otherwise; and
   a flip-flop having a set input terminal coupled to said output terminal of said second logic gate, a reset terminal coupled to said output terminal of said first logic gate, and an output terminal for providing an output signal of the latch circuit.

2. The latch circuit of claim 1 further comprising a final stage latch having a data input terminal coupled to said output terminal of said flip-flop, a clock input terminal for receiving a capture clock signal, and an output terminal for providing a second output signal of the latch circuit.

3. The latch circuit of claim 1 wherein each of said at least three input latches comprises a clocked D-type flip-flop.

4. The latch circuit of claim 1 wherein said first logic state is a logic zero and said second logic state is a logic one.

5. The latch circuit of claim 4 wherein said first logic gate comprises a NOR gate.

6. The latch circuit of claim 4 wherein said second logic gate comprises an AND gate.

7. The latch circuit of claim 1 wherein said flip-flop comprises an SR-type flip-flop.

8. A latch circuit with a metastability trap comprising:
   means for latching an input signal successively at least three times over a predetermined period which is less than half of a fundamental period of said input signal to provide at least three corresponding latched values;
   a first logic gate having input terminals for receiving respective ones of said at least three corresponding latched values, and an output terminal for activating a first intermediate signal when all of said at least three corresponding latched values are in a first logic state, and for keeping said first intermediate signal inactive otherwise;
   a second logic gate having input terminals for receiving respective ones of said at least three corresponding latched values, and an output terminal for activating a second intermediate signal when all of said at least three corresponding latched values are in a second logic state, and for keeping said second intermediate signal inactive otherwise; and
   output means coupled to said first logic gate and to said second logic gate for changing an output signal to a first logic state in response an activation of said second intermediate signal, for changing said output signal to a second logic state in response to an activation of said first intermediate signal, and for maintaining a logic state of said output signal when both said first intermediate signal and said second intermediate signal are inactive.

9. The latch circuit of claim 8 further comprising second output means for periodically capturing said output signal to provide a second output signal.

10. The latch circuit of claim 8 wherein said means for latching comprises at least three clocked D-type flip-flops.

11. The latch circuit of claim 8 wherein said first logic state is a logic zero and said second logic state is a logic one.

12. The latch circuit of claim 8 wherein said means for latching further latches said input signal successively at least three times over said predetermined period using three successive clock signals.

13. The latch circuit of claim 8 wherein said means for latching further latches said input signal successively at least three times over said predetermined period using three successively delayed values of said input signal and a common clock signal.

14. The latch circuit of claim 8 wherein said output means comprises an SR-type flip-flop.

15. A method for trapping metastability events to provide a metastable-free output signal, comprising the steps of:
   latching at least three successive values of an input signal over a predetermined period which is less than half of a fundamental period of said input signal to provide at least three corresponding latched values;
   activating a first intermediate signal when all of said at least three corresponding latched values are in a first logic state;
   activating a second intermediate signal when all of said at least three corresponding latched values are in a second logic state;
   placing an output signal in a first predetermined logic state in response to said second intermediate signal; and
   changing said output signal from said first predetermined logic state to a second predetermined logic state in response to said first intermediate signal.

16. The method of claim 15 further comprising the step of periodically capturing said output signal to provide a second output signal.

17. The method of claim 15 wherein said step of latching comprises the step of latching said input signal in at least three clocked D-type latches each having a D input terminal for receiving said input signal, a clock input terminal for receiving a corresponding one of at least three clock signals, an,d an output for providing a respective one of said at least three corresponding latched values.

18. The method of claim 15 wherein said step of activating said first intermediate signal comprises the step of activating said first intermediate signal using a NOR gate.

19. The method of claim 15 wherein said step of activating said second intermediate signal comprises the step of activating said second intermediate signal using an AND gate.

20. The method of claim 15 further comprising the step of performing said steps of placing said output signal in said first predetermined logic state and changing said output signal from said first predetermined logic state to said second predetermined logic state using an SR-type flip-flop.

* * * * *